(12) United States Patent
Davidovic et al.

(10) Patent No.: US 10,935,639 B2
(45) Date of Patent: Mar. 2, 2021

(54) OPTICAL SENSOR WITH TRANSIMPEDANCE AMPLIFIER CONNECTION

(71) Applicant: Avago Technologies International Sales Pte. Limited, Singapore (SG)

(72) Inventors: Milos Davidovic, Vienna (AT); Reinhard Enne, Hofstetten-Grünau (AT); Gunther Leopold Steinle, Regensburg (DE)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 91 days.

(21) Appl. No.: 16/251,288

(22) Filed: Jan. 18, 2019

(65) Prior Publication Data
US 2020/0233064 A1 Jul. 23, 2020

(51) Int. Cl.
| G01S 7/481 | (2006.01) |
| G01S 7/4865 | (2020.01) |
| G01S 7/4861 | (2020.01) |
| G01S 17/10 | (2020.01) |
| H01L 31/107 | (2006.01) |

(52) U.S. Cl.
CPC ......... *G01S 7/4861* (2013.01); *G01S 7/4816* (2013.01); *G01S 7/4865* (2013.01); *G01S 17/10* (2013.01); *H01L 31/107* (2013.01)

(58) Field of Classification Search
CPC . H03F 2200/135; H04N 5/3745; H04N 5/374
See application file for complete search history.

(56) References Cited

U.S. PATENT DOCUMENTS 6,590,372 B1 * 7/2003 Wiles, Jr. .................. G05F 3/30
323/316
2012/0147237 A1 * 6/2012 Xu .................... H01L 27/14609
348/301

* cited by examiner

*Primary Examiner* — Thanh Luu
(74) *Attorney, Agent, or Firm* — Morgan, Lewis & Bockius LLP

(57) ABSTRACT

Systems and circuits directed to a time-of-flight measurement system are provided. More specifically, an illustrative optical sensor is disclosed to include a plurality of avalanche photodiodes, at least one of the plurality of avalanche photodiodes being in communication with amplifier common node through an impedance converter that is responsive to a control signal and selectively connects or disconnects the at least one avalanche photodiode from the common node based on the control signal. In an example, the impedance converter is also configured to preserve current generated from the at least one avalanche photodiode.

20 Claims, 11 Drawing Sheets

OPTICAL SENSOR WITH TRANSIMPEDANCE AMPLIFIER CONNECTION

FIELD OF THE DISCLOSURE

The present disclosure is generally directed toward optical sensors and the use of impedance converters in connection with the same.

BACKGROUND

Time-of-flight measurement instruments generally include a range imaging camera system that resolves distance based on the known speed of light by measuring the time-of-flight of a light signal between the camera and an object for each point of the image. In some instances, the time-of-flight measurement instrument may utilize one or more photon emitters, such as a laser, Light-Emitting Diode (LED), or other light source, to emit photons, or light, directed to the object. The time-of-flight measurement instrument may utilize an optoelectronic sensor including a photodetector, such as a multi-pixel distance and motion measurement sensor, to receive photons reflected by the object. The time-of-flight measurement instrument and/or the multi-pixel distance and motion measurement sensor may then determine the range, or distance, between the camera and the object.

LIght Detection And Ranging (LIDAR) devices exploit the time-of-flight approach but in contrast to conventional time-of-flight detectors have different requirements, such as longer detection range (e.g., up to 200 m), accuracy on the order of centimeters, a frame rate that is greater than 100 Hz, extremely high background light suppression demands, and a high number of pixels. Because of the extreme requirements on the measured distance, LIDARs typically use built-in amplification photodetectors to cope with long detection ranges.

BRIEF DESCRIPTION OF THE DRAWINGS

The present disclosure is described in conjunction with the appended figures, which are not necessarily drawn to scale.

DETAILED DESCRIPTION

Figure 1:
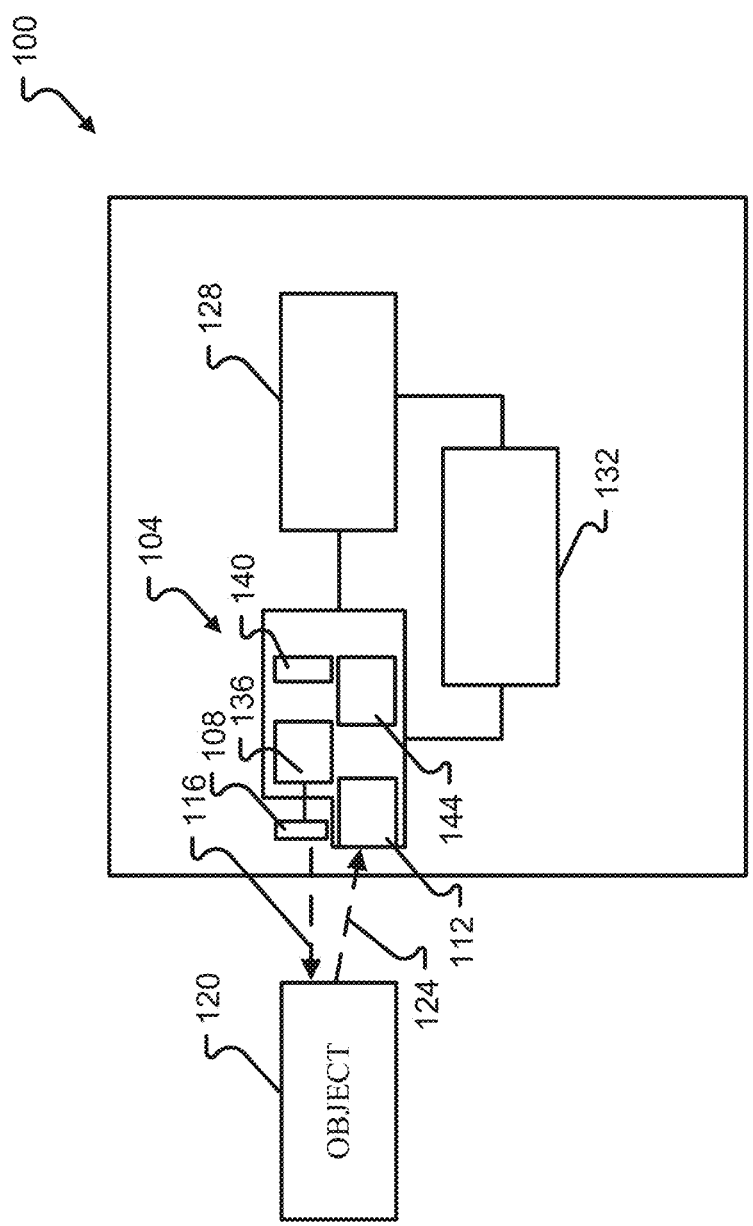
FIG. 1 is a block diagram depicting a time-of-flight measurement system in accordance with at least some embodiments of the present disclosure.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, components, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another—although some features or elements may exhibit discrete changes as well. Thus, the elements illustrated in the drawings are schematic in nature and their shapes are not intended to be limited to the precise shape of an element and are not intended to limit the scope of the present disclosure.

It will be understood that when an element such as a region, component, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

An example of a LIDAR application photodiode matrix may have a pixel array with columns that are activated individually, whereas the rows are read out in parallel over fast Trans-Impedance Amplifiers (TIAs) that are attached to the row buses (common node where all photodiodes in a row are connected to). The fast TIAs are used to handle the time-of-flight backscattered signal whose bandwidth can be even several hundreds of MHz. In some pixel arrays, there can be as many as 96 pixels or more connected to one common node that is connected to the TIA, out of which only one or several pixels are activated, meaning their opto-generated signal is passed through the TIA whilst the other ones are off.

By activating or deactivating switches, a photodiode is connected or not connected to the common node that is connected to the TIA input. However, one side of the switch is connected to this common node and consequently to the TIA at all times. This causes the TIA to see the equivalent impedance of a distributed resistor and capacitor bus network. As is known in circuit design arts, the TIA overall performances, and particularly the noise performances to the largest extent, depend on the input capacitance. In an example where the pixel array includes 96 rows of pixels or more, the conclusion can be drawn that capacitances boost to unacceptable values.

Furthermore, on the path between the selected photodiode and the TIA is also the photodiode capacitance as well as an additional resistance of the closed switch. Considered all together, the performances of such a system are considerably deteriorated if compared to the system where not so many cells are foreseen to be connected in parallel. This is the major bottleneck that prevents a high count photodiode matrix implementation into a LIDAR device.

It is with respect to the above-noted challenges that embodiments of the present disclosure were contemplated. In particular, embodiments of the present disclosure relate to LIDAR applications using linear Avalanche PhotoDiodes (APDs). While embodiments of the present disclosure will be described in connection with an array of APDs, it should be appreciated that embodiments of the present disclosure may utilize any photodiode type, including, without limitation, pn-junction or PIN photodiodes.

In accordance with at least some embodiments, a quadruple well linear APD semiconductor is provided with the ability to mitigate the parasitic capacitance influence of the switches described above. The linear APD, in some embodiments, may provide an intrinsic gain that is used for LIDAR applications and the solution on the problem with the parasitic capacitances may use an integrated impedance converter attached to every linear APD. By activating or deactivating the impedance converter a column will be selected or deselected. In some embodiments, the selective activation and deactivation of the impedance converter helps to selectively omit the switches and the parasitic capacitance.

In accordance with at least one embodiment of the present disclosure, FIG. 1 depicts a time-of-flight measurement system 100. The time-of-flight measurement system 100 may include an optical sensor module 104 having photon circuitry 136 for driving a photon emitter 108 and an optoelectronic sensor 112. The photon emitter 108 is shown as being provided on a separate substrate as the optoelectronic sensor 112, although it should be appreciated that embodiments of the present disclosure are not so limited. The photon emitter 108 may be driven by the photon circuitry 136 and may emit light having one or more wavelengths; such light may travel through space between the photon emitter 108 and an object 120 as a light signal 116. The light signal 116 may encounter the object 120 and be reflected back to the optoelectric sensor 112 of the time-of-flight measurement system 100 as a reflected light signal 124. The time-of-flight measurement system 100, and more specifically, the photodetector and emitter 104, may determine an amount of time between when the photon emitter 108 emitted the light and when the optoelectronic sensor 112 received the reflected light, known as time-of-flight. As the light signal 116 and reflected light signal 124 travel through space at, or close to, the speed of light, the time-of-flight may be utilized to determine a distance between the optical sensor module 104 of the time-of-flight measurement system 100 and the object 120.

In accordance with at least one embodiment of the present disclosure, the optical sensor module 104 may be monolithically integrated into a single die. Alternatively, or in addition, any circuitry that runs synchronously at a clock frequency in which the photodetector operates may reside at the shared substrate. The shared substrate may be part of a standalone package or device. Alternatively, or in addition, the shared substrate may be part of an ASIC. For example, the optical sensor module 104 may be an ASIC and may further include time-of-flight circuits 140, one or more clocks 144, and one or more power regulation means. The time-of-flight measurement system 100 may include a CPU/processor 128 to receive a time-of-flight quantity and determine an overall distance between the optical sensor module 104 and the object 120. The CPU/processor 128 may then store the determined distance in the memory 132. Alternatively, or in addition, the time-of-flight quantity and/or the determined distance may be determined at the optical sensor module 104 and stored in the memory 132, where the CPU/processor 128 may access the memory 132. The CPU/processor 128 may be referred to herein as control logic and may be executed in separate processing IC chips or on control logic that is integrated with one of the other substrates depicted and described herein.

Figure 2A:
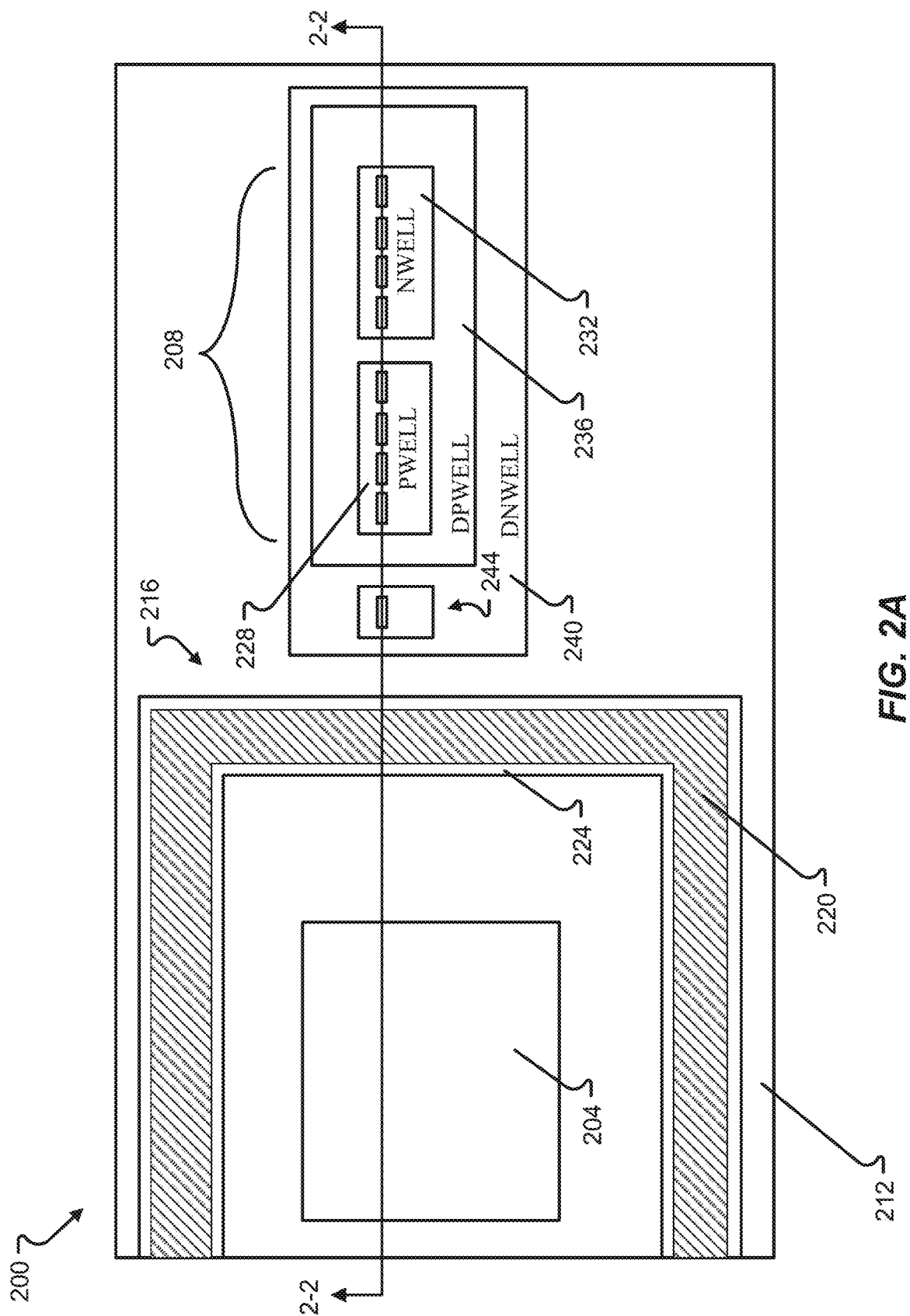
FIG. 2A depicts a block diagram illustrating a top view of a photodetector and emitter circuitry in accordance with at least some embodiments of the present disclosure.
Figure 2B:
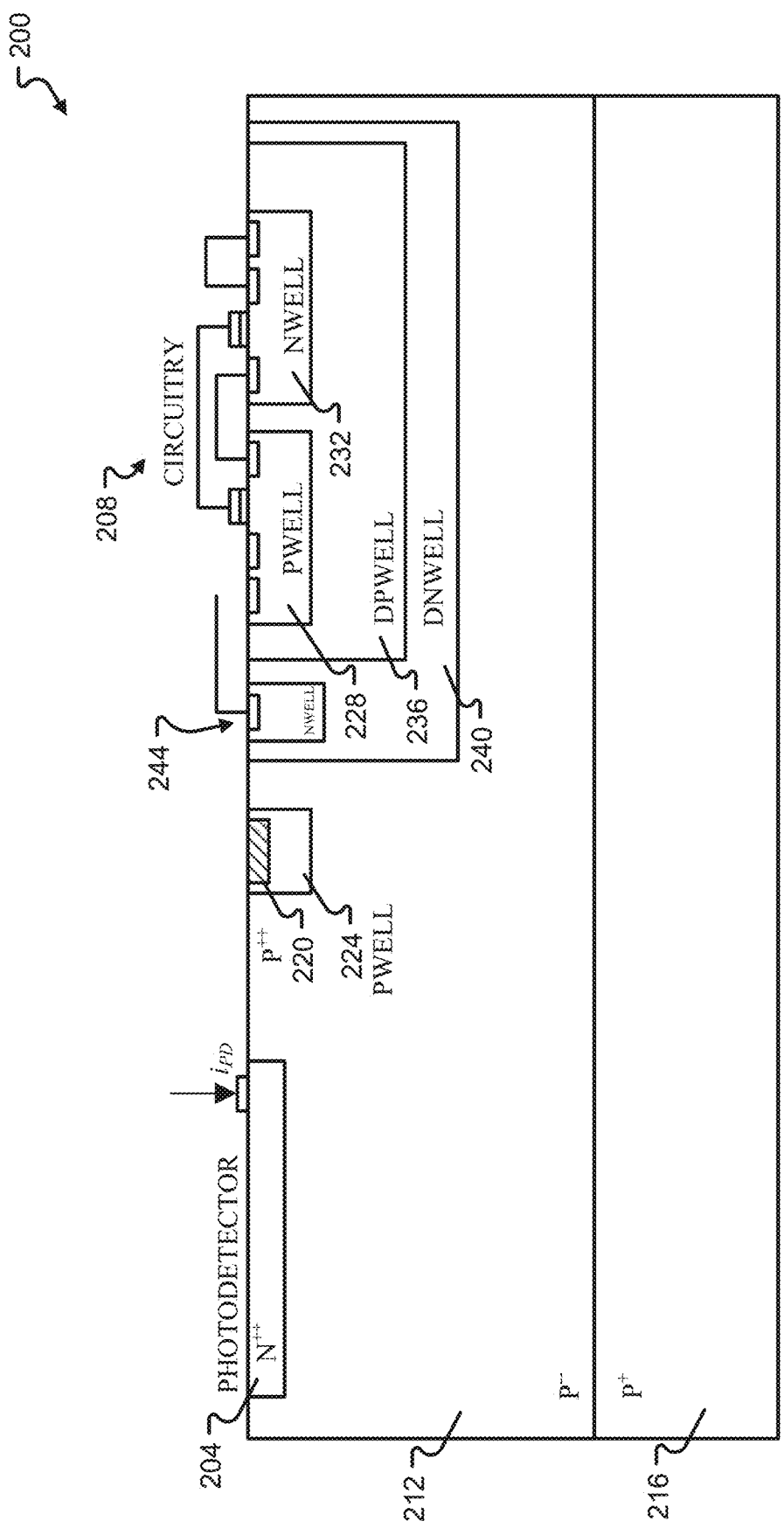
FIG. 2B depicts a block diagram illustrating a side view of the photodetector and emitter circuitry in accordance with at least some embodiments of the present disclosure.

As previously discussed, the photon emitter circuitry 136 and the optoelectronic sensor 112 may reside at the same substrate, as illustrated in FIGS. 2A and 2B. The optoelectronic sensor 112 may include, or otherwise be known as, a photodetector 204. The photodetector 204 may include a plurality of photodiodes forming pixels configured to receive light and convert the light into a corresponding amount of current. The photodetector 204 may be characterized through several parameters among which include, but are not limited to, its capacitance, quantum efficiency, and noise performance.

As illustrated in FIG. 2A, the photodetector 204 may reside on a same substrate 212 as the circuitry 208, where the circuitry may comprise an impedance converter and/or other circuitry utilized in the time-of-flight conversion process. The photodetector 204 may be separated from the circuitry 208 with a P-well contact ring, where the P-well contact ring includes a P++ impurity region 220 formed in a P-well 224 and the P-well contact ring surrounds the photodetector 204. The P-well contact ring may ensure a solid connection underneath the opto-sensitive area of the photodetector 204 to enhance the light-to-current conversion performance of the photodetector 204. The circuitry 208 may include a quadruple well including a Pwell 228, Nwell 232, deep P-well DPwell 236, and deep Nwell DNwell 240. That is, the circuitry 208 may be insulated with a deep Nwell 240 which serves to decouple the PMOS transistors (realized in Nwell 232) or NMOS transistors (realized in Pwell 228) from the substrate 212. The deep p-doped well DPwell 236 is connected via Pwell 228 which serves as the electrode at the same time. The circuitry 208 may further include an electrode 244 coupled to the DNwell 240 and the Nwell 232 such that the DNwell 240 can be connected to a defined voltage potential.

FIG. 2B depicts a side view of the photodetector and emitter circuitry of FIG. 2A along the section line 2-2, in accordance with at least one embodiment of the present disclosure. In cases of fast optical receivers, a low-doped P-- epitaxial layer is used to realize the substrate 212. In such an embodiment, the low-doped P- epitaxial layer is utilized to ensure that the conversion from light to electricity occurs in a timely manner with respect to the speed at which the photodetector 204 operates. The low-doped P-- epitaxial layer, in some embodiments, minimizes a diffusion portion of the generated $i_{PD}$ optocurrent that may be generated. The diffusion effect of the current $i_{PD}$ is generally responsible for delaying the conversion of electron-hole pairs into photocurrent and therefore slows the response time of the photodetector 204. Accordingly, if the low-doped P-- epitaxial layer is not included, the speed of the photodetector 204 will be limited. Thus, a structure without the low-doped P-- epitaxial layer is possible if a high-speed photodetector is not needed.

As previously described, the circuitry 208 may be insulated with a deep Nwell 240 which serves to decouple the NMOS transistors from the P+ substrate 216. With respect to the P+ substrate 216, the DNwell 240 may be considered to be a large reversely biased diode having a capacitance equal to $C_{DNW}$. Thus, in order to avoid any direct diode biasing, the DNwell 240 may be biased at the highest voltage that is present within the contents of the well, which is normally $V_{DD}$. Since the same $V_{DD}$ voltage is used to supply all of the digital and analog circuitry within the optical sensor module 200, $V_{DD}$ is normally very noisy. Thus, when the parasitic capacitance $C_{DNW}$ is considered, any voltage fluctuation of $V_{DD}$ will cause a proportional voltage change underneath DNwell 240, referred herein as $V_{X1}$.

A Pwell contact ring may surround each and every circuit block to pick up any noise in the substrate caused by the circuitry and consequently may provide a better voltage stability. However, considering the P-- epitaxial layer 212 included for better dynamic photon detection, such P- epitaxial layer 212 will increase the series resistance between the contact and the underlying P+ layer 216. As a consequence, the noise pick-up effectiveness will depend on the ratio between the resistance of the P-- portion and resistance of the substrate.

In accordance with at least one embodiment of the present disclosure, a low-doped epitaxial layer 212 having a P-conductivity type of a low doped P-- impurity may be utilized. Such low-doped epitaxial layer 212 having the P-conductivity type of low doped P-- impurity region 212 may be useful for the photodetector 204 to operate effectively.

In accordance with at least one embodiment of the present disclosure, the DNwell 240 may be roughly three micrometers in depth while the P-- epitaxial layer 212 may be 20 micrometers in thickness. Alternatively, or in addition, the P-- epitaxial layer 212 may be less than 20 micrometers in thickness or greater than 20 micrometers in thickness. Alternatively, or in addition, a depth of the DNwell 240 may be less than or equal to three micrometers or greater than or equal to three micrometers.

Embodiments of the present disclosure contemplate combining the structure from FIGS. 2A and 2B and making use of the CMOS circuitry within every cell to mitigate the parasitic capacitance influence of the switches $S_{1-N}$ used to connect a corresponding photodiode $P_{D1-N}$ to the common node that is connected to the TIA. A linear APD, in some embodiments, will provide intrinsic gain that is necessary for LIDAR applications and the solution on the problem with the parasitic capacitances will now be explained.

Figure 3:
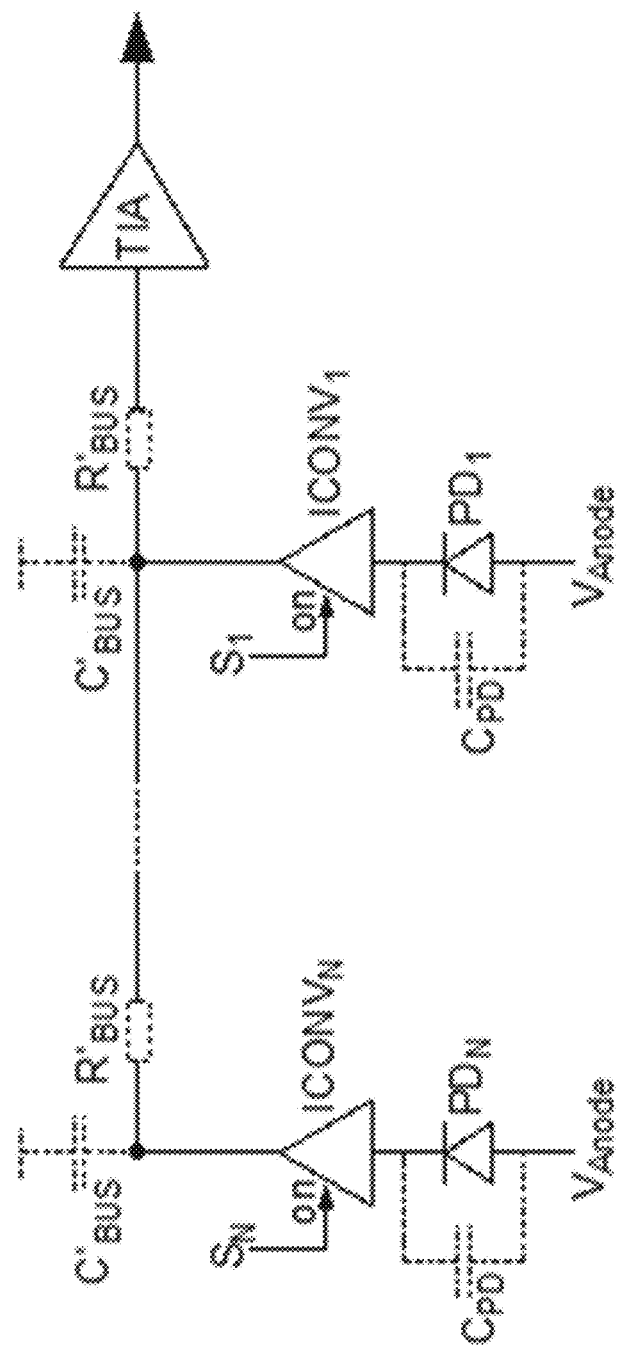
FIG. 3 is a circuit diagram illustrating a first circuit in accordance with at least some embodiments of the present disclosure.

Embodiments of the present disclosure propose to use an integrated impedance converter ICONV attached to every linear APD as illustrated in FIG. 3. Each integrated impedance converter ICONV may be operated under control of a corresponding control signal or switch S. Each column in the pixel array may have one or more photodiodes PD that have an anode voltage $V_{anode}$. The one or more photodiodes PD may also have an inherent capacitance $C_{PD}$ as discussed above. Each of the columns in the pixel array may further connect with a row bus and contribute a corresponding bus capacitance $C'_{BUS}$ and bus resistance $R'_{BUS}$ to the equivalent circuit. In some embodiments, the operation of the control signals or switches $S_{1-N}$ may help to avoid the unwanted contribution of multiple photodiode capacitances $C_{PD}$ to the equivalent circuit. The operation of the control signals or switches $S_{1-N}$ may also help to reduce the unwanted background light that will be present at every diode.

As shown in FIG. 3, there may be a number of integrated impedance converters ICONV that is equal to a number of columns in the pixel array. By activating or deactivating the impedance converter ICONV for a particular column, the corresponding column will be selected or deselected. For example, a selection of a first column may be achieved by providing an activate signal with the first control signal or switch $S_1$ to the first integrated impedance converter $ICONV_1$. When the first integrated impedance converter $ICONV_1$ is receiving an activate signal from the first control signal or switch $S_1$, the other columns, such as the Nth column, may receive a deactivate signal from the Nth control signal switch $S_N$ at the Nth integrated impedance converter $ICONV_N$, thereby omitting the capacitance $C_{PD}$ of the photodiodes $PD_N$ connected thereto from the equivalent circuit that includes the TIA. Thus, only the capacitance $C_{PD}$ of the first photodiode $PD_1$ contributes to the capacitance of the circuit providing current to the TIA.

In accordance with at least some embodiments, each of the impedance converters ICONV can be any circuit that is able to convert the impedance preserving the current that is generated from the photodiodes PD. In some embodiments, an impedance converter ICONV may also be referred to as a current buffer circuit. In some embodiments, the impedance converters ICONV behave as almost ideal current sources without having output capacitance.

Figure 4:
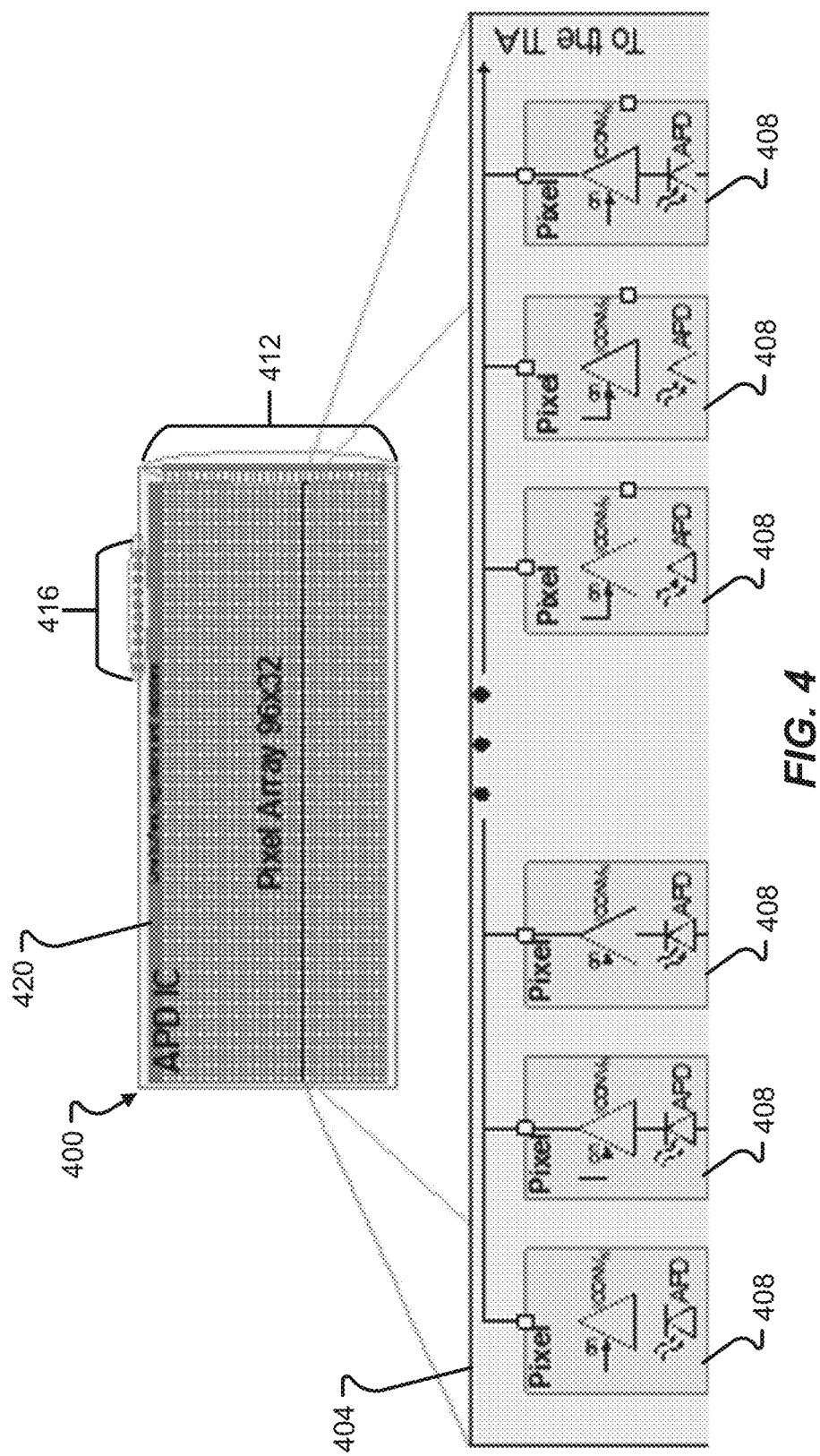
FIG. 4 depicts an illustrative pixel array and details of a row of pixels in accordance with at least some embodiments of the present disclosure.

Referring back to the photodiode described herein above, embodiments of the present disclosure propose an APD quadruple well structure with the impedance converters ICONV$_X$ as shown in FIG. 4.

As can be seen in FIG. 4, the pixel array 400 comprises a plurality of pixels 408 arranged in plurality of rows 404. Each row 404 may comprise multiple pixels 408, each pixel belonging to a different column of the pixel array 400. In some embodiments, the pixel array may correspond to an N×M array of pixels arranged on an APD IC chip. As a non-limiting example, the pixel array may comprise at least 96 columns and 32 rows of pixels 408. Each row 404 may be electrically connected to a common node that is connected to the TIA, via a TIA pad 412. The pixel array 400 is also shown to include a plurality of voltage supply and voltage control pads 416 that receive a supply voltage Vdd and control voltage from external driver circuitry.

In some embodiments, the pixel array 400 may also include line buffers, regulators, and decoders 420 that connect the supply and control pads 420 to each column in the pixel array 400. As shown in FIG. 4, each pixel 408 in the row 404 may connect to the common node that is connected to the TIA through a dedicated integrated impedance converter ICONV. As discussed above, each integrated impedance converter ICONV is configured to operate responsive to an activation or deactivation signal provided by a corresponding control signal or switch S. Deactivation of a particular pixel 408 on an otherwise active row 404 may help reduce the overall capacitance at the TIA because the inherent capacitance of an APD can be kept from connecting with the row bus.

Figure 5:
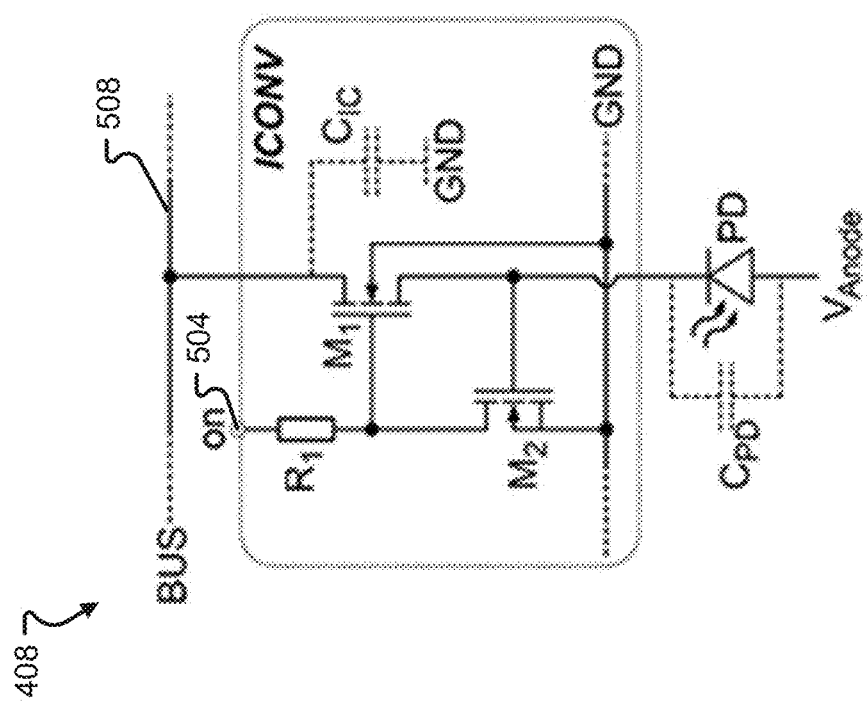
FIG. 5 is a circuit diagram illustrating a second circuit in accordance with at least some embodiments of the present disclosure.

In some embodiments, the integrated impedance converters ICONV can be realized in the semiconductor technology using only NMOSFETs or NPN bipolar transistors. An example is shown in FIG. 5 in accordance with at least some embodiments of the present disclosure. This pixel 408 circuit, in some embodiments, may include a first transistor M$_1$ and second transistor M$_2$ connective in a negative feedback, whereby the second transistor M$_2$ operates as an amplifying transistor and the first transistor M$_1$ operates as a current buffer that closes the negative feedback and keeps the PD voltage at a constant self-biased level. The resistor R$_1$, in some embodiments, serves to bias the second transistor M$_2$. The integrated impedance converter ICONV is turned on or off by applying a control voltage 504 at the resistor R$_1$ or an input pin connected to the integrated impedance converter ICONV.

Now, bearing the circuit functionality in mind, it can be seen that the output of the integrated impedance converter ICONV will act as ideal current source outputting the photo generated current but having, at the same time, only the capacitance of the transistor M$_1$, which may be referred to as a switch capacitance C$_{IC}$. This switch capacitance C$_{IC}$ can be made very small as the first transistor M$_1$ doesn't have to be made excessively large. In this way, the influence of C$_{PD}$, S$_X$ and C$_{SW}$ on the row bus 508 are effectively reduced. In practice, a factor of ten can be gained on parasitic capacitance reduction.

Figure 6:
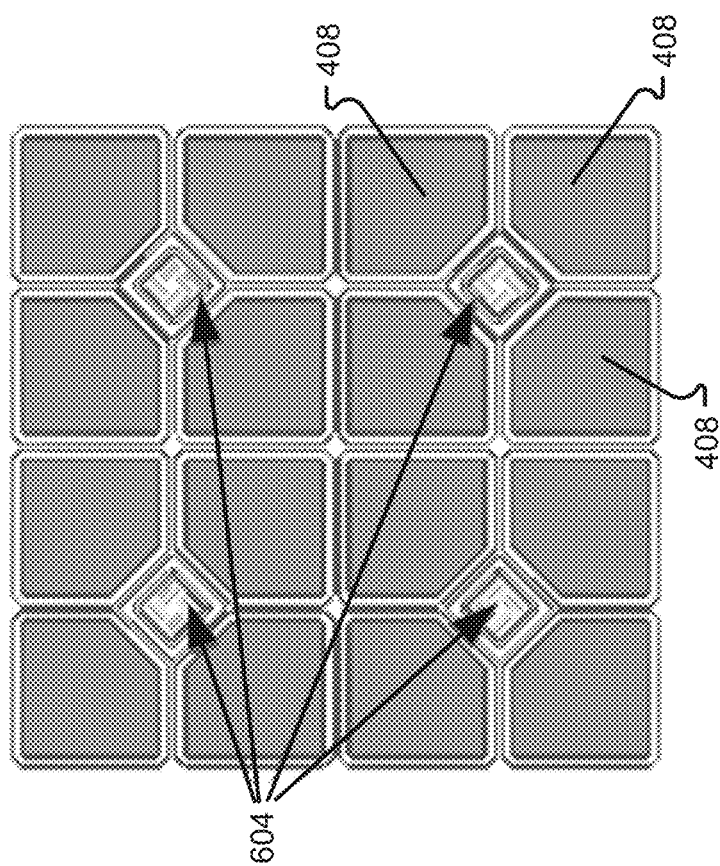
FIG. 6 is a top view of a plurality of pixels with shared circuit islands in accordance with at least some embodiments of the present disclosure.
Figure 7B:
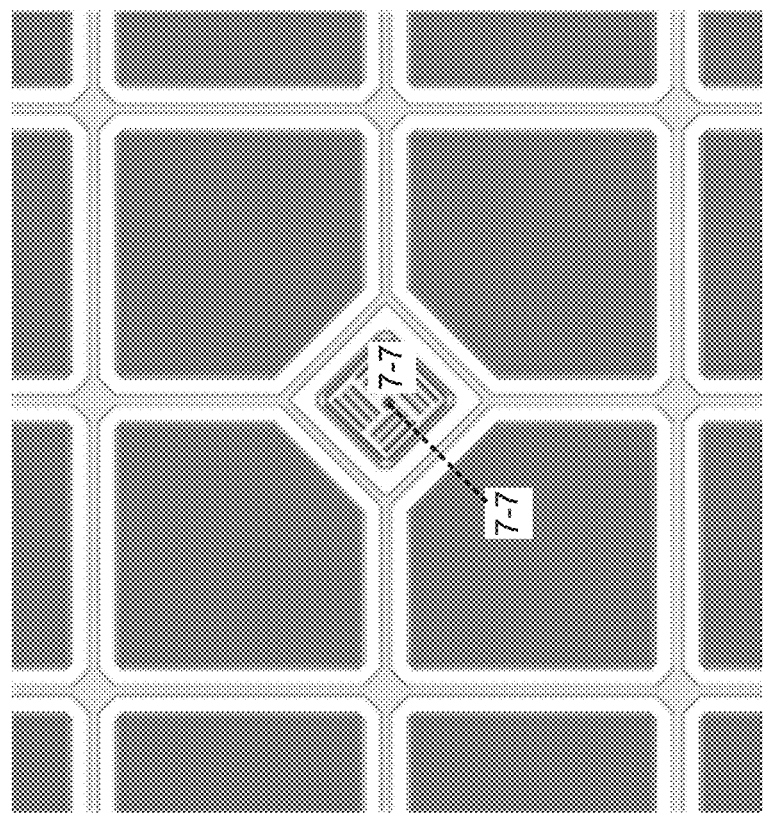
FIG. 7B is a cross-sectional side view of the shared circuit island from FIG. 7A.
Figure 7A:
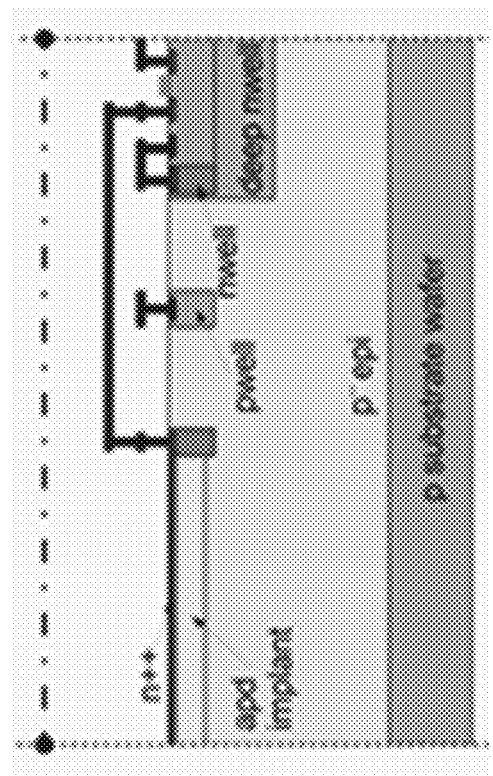
FIG. 7A is a top view of a shared circuit island in accordance with at least some embodiments of the present disclosure.

With reference now to FIGS. 6, 7A, and 7B, an illustrative layout of the APD pixel matrix including the pixel 408 circuit from FIG. 5 will be described in accordance with at least some embodiments of the present disclosure. Referring initially to FIG. 6, it can be seen that the pixel array 400 may include at least some circuit islands 604 that are distributed throughout the pixels 408. In some embodiments, a single circuit island 604 is shared between four adjacent pixels 408.

Thus, a circuit island 604 may be provided between a shared corner of four adjacent pixels 408.

As can be seen in FIGS. 7A and 7B, the pixel island 604 may comprise a cross-sectional layout that is similar to the construction of the optical sensor module 200. Specifically, each pixel island 604 may comprise four quantum well structures having an Nwell Pwell, DPwell, and DNwell as discussed in connection with FIGS. 2A and 2B. In some embodiments, since a linear APD utilizes a relatively high bias voltage, being typically in the range of 30V to 100V, a large clearance between the circuitry and the APD area should be maintained. Thus, in some embodiments, the circuit islands 604 are introduced and may include four integrated impedance converters ICONV. Each of the four integrated impedance converters ICONV of a circuit island 604 may be used to convert the impedance of a different pixel 408 that is adjacent to the pixel island 604.

Figure 8:
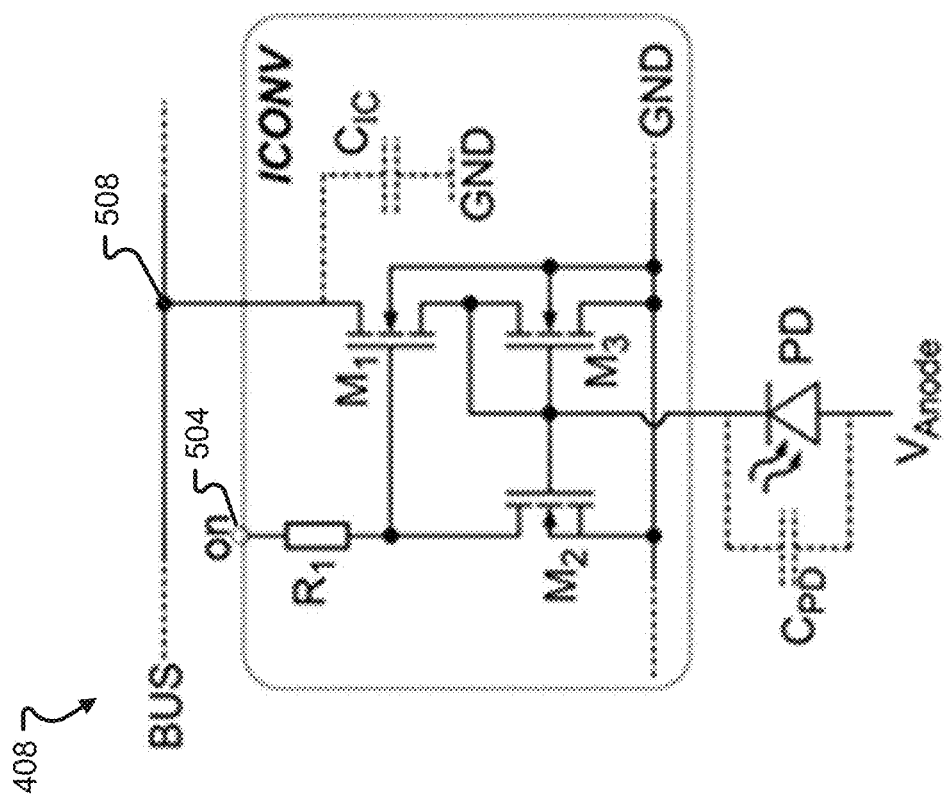
FIG. 8 is a circuit diagram illustrating a third circuit in accordance with at least some embodiments of the present disclosure.

With reference now to FIG. 8, an alternative circuit configuration for a pixel 408 will be described in accordance with at least some embodiments of the present disclosure. In some embodiments, the circuit of FIG. 5 may not be able to provide a sufficient bias, which may or may not be a constant bias, to the first transistor M$_1$. Accordingly, embodiments of the present disclosure contemplate a pixel 408 circuit as shown in FIG. 8 where an additional third transistor M$_3$ is utilized to provide a bias current. In some embodiments, the third transistor M$_3$ may be provided between ground GND and the first transistor M$_1$ and may be controlled by the same control signal as the first transistor M$_1$. In some embodiments, the gate of the third transistor M$_3$ is directly electrically connected to the gate of the second transistor M$_2$, which are both directly connected to the source of the first transistor M$_1$. In this way, the third transistor M$_3$ is configured to provide a bias current that substantially constantly biases the first transistor M$_1$.

Figure 9:
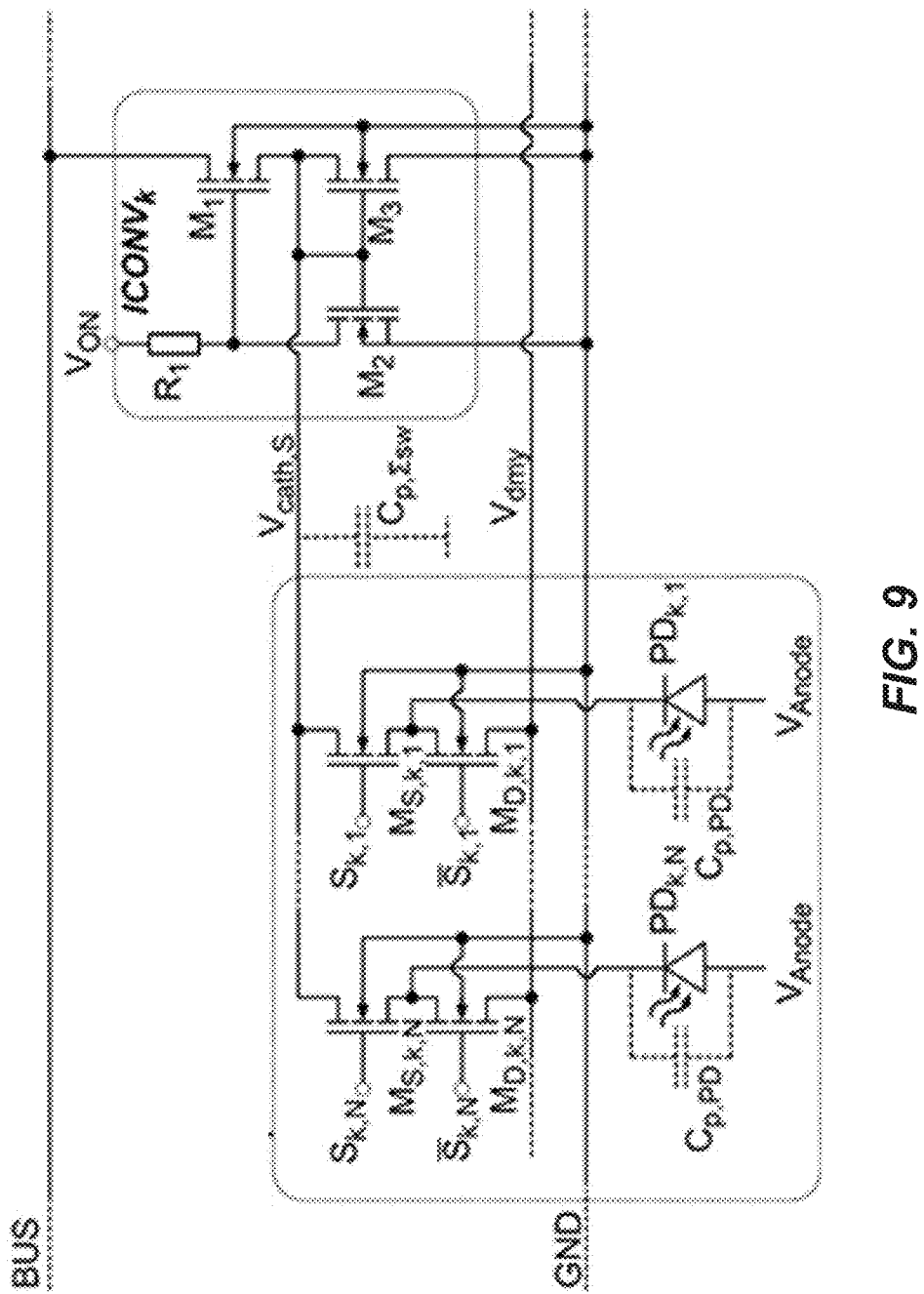
FIG. 9 is a circuit diagram illustrating a fourth circuit in accordance with at least some embodiments of the present disclosure.

With reference now to FIG. 9, another possible layout of a circuit will be described in accordance with at least some embodiments of the present disclosure. In this particular embodiment, multiple photodiodes PD can be connected to only one integrated impedance converter ICONV. That is, multiple photodiodes PD, connected in parallel with one another, may share one node of an integrated impedance converter ICONV. The configuration of the integrated impedance converter ICONV may be similar to the configuration depicted in FIG. 4 and/or the configuration depicted in FIG. 8.

Figure 10:
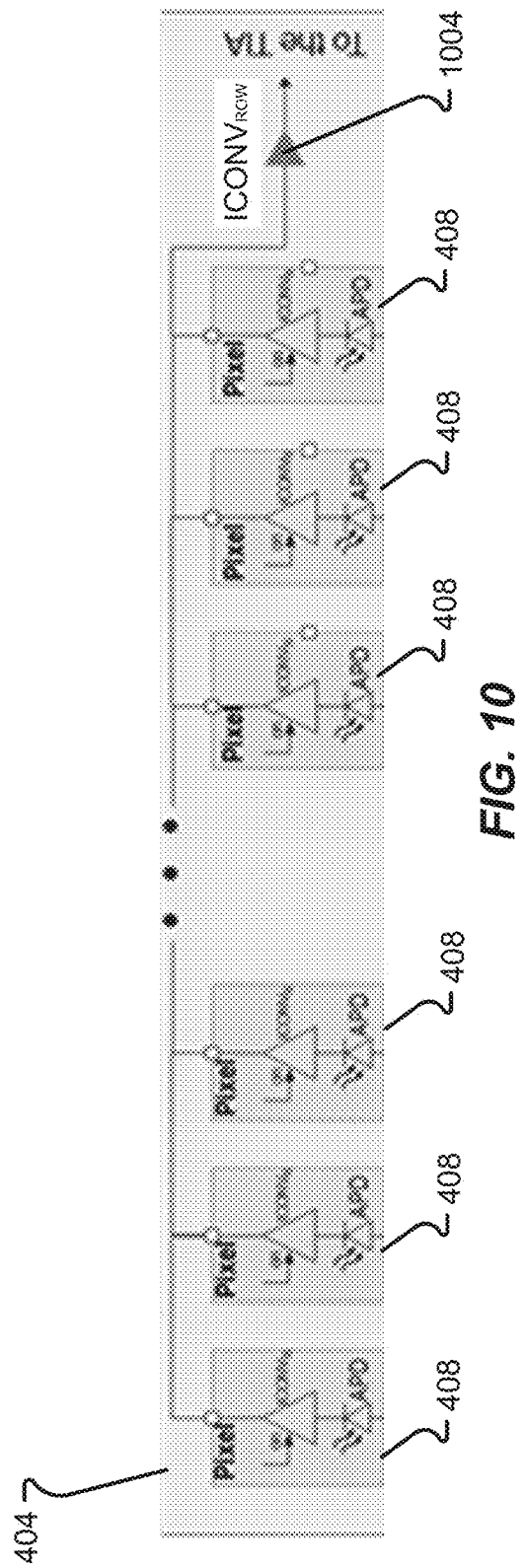
FIG. 10 depicts an alternative configuration of a row of pixels in accordance with at least some embodiments of the present disclosure.

In accordance with at least some embodiments, an integrated impedance converter ICONV can be connected at the common node at the end of every row 404 such that each row 404 of the array 400 may be configured to connect with a shared TIA. Such a layout would follow the configuration depicted in FIG. 10. In such a situation, the impedance converter for a row ICONV$_{ROW}$ 1004 may be connected in series between the row 404 and the TIA. This additional impedance converter 1004 may provide a design flexibility for enabling more rows 404 to connect with a common TIA without losing performance capabilities.

In accordance with at least some embodiments, a circuit is provided that includes: a first photodiode configured to convert light energy into a first electrical signal; a first impedance converter connected between an output of the first photodiode and a common node that is connected to an amplifier, wherein the first impedance converter is responsive to a first control signal and selectively connects or disconnects the first photodiode from the common node based on the first control signal, and wherein the first impedance converter is also configured to preserve current generated from the first photodiode; a second photodiode configured to convert light energy into a second electrical signal, wherein the second photodiode is connected in parallel with the first photodiode; and a second impedance converter connected between an output of the second photodiode and the common node that is connected to the amplifier, wherein the second impedance converter is responsive to a second control signal and selectively connects or disconnects the second photodiode from the common node based on the second control signal, and wherein the second impedance converter is also configured to preserve current generated from the second photodiode.

In some embodiments, the first impedance converter behaves as a first ideal current source without having an output capacitance and wherein the second impedance converter behaves as a second ideal current source without having an output capacitance.

In some embodiments, the first impedance converter comprises a first pair of transistors connected in a negative feedback configuration. Alternatively or additionally, the second impedance converter comprises a second pair of transistors connected in a negative feedback configuration. Alternatively or additionally, the first pair of transistors comprises a first transistor that operates as an amplifying transistor and a second transistor that operates as a current buffer that closes the negative feedback and maintains a voltage of the first photodiode at a substantially constant self-biased level. Alternatively or additionally, the first impedance converter further comprises a third transistor that provides a bias current for at least one of the transistors in the first pair of transistors. Alternatively or additionally, the first impedance converter further comprises a resistor that is connected with the second transistor to provide bias to the second transistor. Alternatively or additionally, the first control signal comprises a voltage applied to the resistor.

In some embodiments, the first photodiode comprises a first avalanche photodiode and wherein the second photodiode comprises a second avalanche photodiode.

In some embodiments, the first impedance converter is connected between the common node that is connected to the amplifier and a first column of photodiodes and wherein the second impedance converter is connected between the common node that is connected to the amplifier and a second column of photodiodes.

In some embodiments, the light comprises near-infrared light.

In some embodiments, the amplifier comprises a transimpedance amplifier.

In accordance with at least some embodiments, a semiconductor device is provided that includes: an array of photodiodes, at least one photodiode from the array of photodiodes being connected to one common node that is connected with an amplifier through an impedance converter that is responsive to a control signal and selectively connects or disconnects the at least one photodiode from the common node that is connected to the amplifier based on the control signal, wherein the impedance converter is also configured to preserve current generated from the at least one photodiode.

In some embodiments, the impedance converter behaves as an ideal current source having virtually no output capacitance.

In some embodiments, the impedance converter comprises a first transistor and a second transistor connected in a negative feedback configuration. Alternatively or additionally, the first transistor operates as an amplifying transistor and the second transistor operates as a current buffer that closes the negative feedback and maintains a voltage of the at least one photodiode at a substantially constant self-biased level.

In accordance with at least some embodiments, an optical sensor is provided that includes: a plurality of avalanche photodiodes, at least one of the plurality of avalanche photodiodes being connected to one common node that is connected with an amplifier through an impedance converter that is responsive to a control signal and selectively connects or disconnects the at least one avalanche photodiode from the common node that is connected to the amplifier based on the control signal, wherein the impedance converter is also configured to preserve current generated from the at least one avalanche photodiode.

In some embodiments, the impedance converter comprises a first transistor and a second transistor connected in a negative feedback configuration, wherein the first transistor operates as an amplifying transistor, and wherein the second transistor operates as a current buffer that closes the negative feedback and maintains a voltage of the at least one avalanche photodiode at a substantially constant self-biased level. Alternatively or additionally, the impedance converter further comprises a third transistor that provides a bias current for the first transistor.

In some embodiments, two or more avalanche photodiodes from the plurality of avalanche photodiodes are connected to the common node that is connected to the amplifier through the impedance converter.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A circuit, comprising:
   a first photodiode configured to convert light energy into a first electrical signal;
   a first impedance converter connected to the output of the first photodiode, wherein the first impedance converter is responsive to a first control signal and selectively connects or disconnects the first photodiode from a common node based on the first control signal, and wherein the first impedance converter is also configured to preserve current generated from the first photodiode, wherein the common node is connected to an input of an amplifier and the first impedance converter is connected between the amplifier and a first column of photodiodes that includes the first photodiode;
   a second photodiode configured to convert light energy into a second electrical signal, wherein the second photodiode is connected in parallel with the first photodiode; and
   a second impedance converter connected to the output of the second photodiode, wherein the second impedance converter is responsive to a second control signal and selectively connects or disconnects the second photodiode from the common node based on the second control signal, and wherein the second impedance converter is also configured to preserve current generated from the second photodiode.

2. The circuit of claim 1, wherein the first impedance converter is further connected to the amplifier, wherein the second impedance converter is also connected to the amplifier, wherein the first impedance converter behaves as a first ideal current source having substantially no output capacitance, and wherein the second impedance converter behaves as a second ideal current source having substantially no output capacitance.

3. The circuit of claim 1, wherein the first impedance converter comprises a first pair of transistors connected in a negative feedback configuration.

4. The circuit of claim 3, wherein the second impedance converter comprises a second pair of transistors connected in a negative feedback configuration.

5. The circuit of claim 3, wherein the first pair of transistors comprise a first transistor that operates as an amplifying transistor and a second transistor that operates as a current buffer that closes the negative feedback and maintains a voltage of the first photodiode at a substantially constant self-biased level.

6. The circuit of claim 5, wherein the first impedance converter further comprises a third transistor that provides a bias current for at least one of the transistors in the first pair of transistors.

7. The circuit of claim 5, wherein the first impedance converter further comprises a resistor that is connected with the second transistor to provide bias to the second transistor.

8. The circuit of claim 7, wherein the first control signal comprises a voltage applied to the resistor.

9. The circuit of claim 1, wherein the first photodiode comprises a first avalanche photodiode and wherein the second photodiode comprises a second avalanche photodiode.

10. The circuit of claim 1, wherein the second impedance converter is connected between the amplifier and a second column of photodiodes.

11. The circuit of claim 1, wherein the light comprises near-infrared light.

12. The circuit of claim 1, wherein the amplifier comprises a trans-impedance amplifier.

13. A semiconductor device, comprising:
an array of photodiodes, at least one photodiode from the array of photodiodes being selectively attached to a common node through an impedance converter that is responsive to a control signal and selectively connects or disconnects the at least one photodiode from the common node based on the control signal, wherein the impedance converter is also configured to preserve current generated from the at least one photodiode,
wherein the impedance converter comprises a pair of transistors connected in a negative feedback configuration, and a resistor that is connected with a transistor of the pair of transistors to provide bias to the transistor.

14. The semiconductor device of claim 13, wherein the impedance converter behaves as an ideal current source having substantially no output capacitance.

15. The semiconductor device of claim 13, wherein the impedance converter comprises a first transistor and a second transistor connected in a negative feedback configuration and wherein the common node is connected with an amplifier.

16. The semiconductor device of claim 15, wherein the first transistor operates as an amplifying transistor and the second transistor operates as a current buffer that closes the negative feedback and maintains a voltage of the at least one photodiode at a substantially constant self-biased level.

17. An optical sensor, comprising:
a plurality of avalanche photodiodes, at least one of the plurality of avalanche photodiodes being selectively connected to a common node through an impedance converter that is responsive to a control signal and selectively connects or disconnects the at least one avalanche photodiode from the common node based on the control signal, wherein the impedance converter is also configured to preserve current generated from the at least one avalanche photodiode, wherein the common node is connected to an input of an amplifier and the impedance converter is connected between the amplifier and a first column of the plurality of avalanche photodiodes.

18. The optical sensor of claim 17, wherein the common node is connected directly to an input for an amplifier, wherein the impedance converter comprises a first transistor and a second transistor connected in a negative feedback configuration, wherein the first transistor operates as an amplifying transistor, and wherein the second transistor operates as a current buffer that closes the negative feedback and maintains a voltage of the at least one avalanche photodiode at a substantially constant self-biased level.

19. The optical sensor of claim 18, wherein the impedance converter further comprises a third transistor that provides a bias current for the first transistor.

20. The optical sensor of claim 18, wherein two or more avalanche photodiodes from the plurality of avalanche photodiodes are connected to the amplifier through the impedance converter.

* * * * *